JAMES R. BIARD,
EDWARD L. BONIN,
JACK S. KILBY,
GARY E. PITTMAN
INVENTORS

BY John G. Graham
ATTORNEY

PHOTOSENSITIVE TRANSISTOR CHOPPER USING LIGHT EMISSIVE DIODE

Filed Nov. 29, 1963 3 Sheets-Sheet 2

JAMES R. BIARD,
EDWARD L. BONIN,
JACK S. KILBY,
GARY E. PITTMAN
INVENTORS

BY John G. Graham

ATTORNEY

JAMES R. BIARD
EDWARD L. BONIN
JACK S. KILBY
GARY E. PITTMAN
INVENTORS

BY John G. Graham

ATTORNEY 3,304,431

PHOTOSENSITIVE TRANSISTOR CHOPPER USING LIGHT EMISSIVE DIODE

James R. Biard and Edward L. Bonin, Richardson, and Jack S. Kilby and Gary E. Pittman, Dallas, Tex., assignors to Texas Instruments Incorporated, Dallas, Tex., a corporation of Delaware Filed Nov. 29, 1963, Ser. No. 327,140
18 Claims. (Cl. 250—217)

The present invention relates generally to a transistor chopper. More particularly, it relates to a transistor chopper operated in response to optical radiation to provide complete electrical isolation between the driving source and the input and output terminals of the chopper, and is characterized by a very low offset voltage between the input and output terminals when the switch is closed, which has primary utility for switching low level signals.

Complete electrical isolation of the switch element in a chopper from the driving source for opening and closing the switch element is not possible in conventional systems even though the use of an isolation transformer separating the driving source and the switch element, since magnetic pick-up and spike feed-through resulting from transformer winding capacitance occurs. Thus there is a limit on the minimum level of signal, whether current or voltage, that can be switched in conventional systems without altering the switched signal. Moreover, isolation transformers are bulky and expensive which prohibits their use in miniaturized circuits.

Since the transistor is the active switching element of the transistor chopper, the switch is closed when the transistor is conducting and open when it is nonconducting. In its conductive state the transistor does not act as an ideal short circuit but has an equivalent series resistance and junction voltage, the latter which limits to a minimum the smallest voltage that can be chopped. To reduce the effect of the junction voltage, conventional transistor choppers utilize a pair of transistors connected in series but in opposite polarities such that the junction voltage, or so-called "off-set" voltage, is reduced or cancelled. Difficulty is experienced, however, in providing two identical transistors to exactly cancel the off-set voltage.

The chopper circuit of the present invention comprises, in its preferred embodiment, a double emitter, photosensitive transistor optically coupled to a semiconductor junction diode which generates light or optical radiation for causing the transistor to conduct when a forward current bias is generated across the junction of the diode. The light generated has a photon energy greater than the band gap energy of the particular semiconductor material of which the photosensitive transistor is fabricated, as will be described hereinafter. For purposes of the present invention, the terms light and optical radiation are used interchangeably and are defined to include electromagnetic radiation in the wavelength region from the near infrared into the visible spectrum. It can readily be seen that the means for driving the chopper, or opening and closing the transistor switch, is completely electrically isolated from the input and the output of the chopper circuit, the latter which is the two terminals of the transistor switch. In addition, the light emitted by the diode may be intensity modulated at an extremely high frequency by the application to the diode junction of a high frequency alternating voltage, thus providing means for turning the photoconductive transistor on and off extremely rapidly, or for converting a D.C. voltage to the input of the chopper to a high frequency alternating voltage at the output. The fast switching action provided by the present invention also reduces the noise generated by the switch in the transition from an open to a closed condition, or vice-versa. Moreover, the relative orientation of the junction diode and the photoconductive transistor may be adjusted during fabrication in order to reduce the off-set voltage of the transistor to an arbitrarily small value. Another embodiment of the invention which uses a pair of transistors having commonly connected bases and collectors may also be used in conjunction with the junction diode. In either case, the invention has primary application to miniature circuits because of the use of a solid-state light source in which the intensity of the light can be modulated as a function of an electrical signal input at a very high frequency.

Other objects, features, and advantages will become apparent from the following detailed description when taken in conjunction with the appended claims and the attached drawing in which like reference numerals refer to like parts throughout the several figures, and in which:

Figures 3, 4:
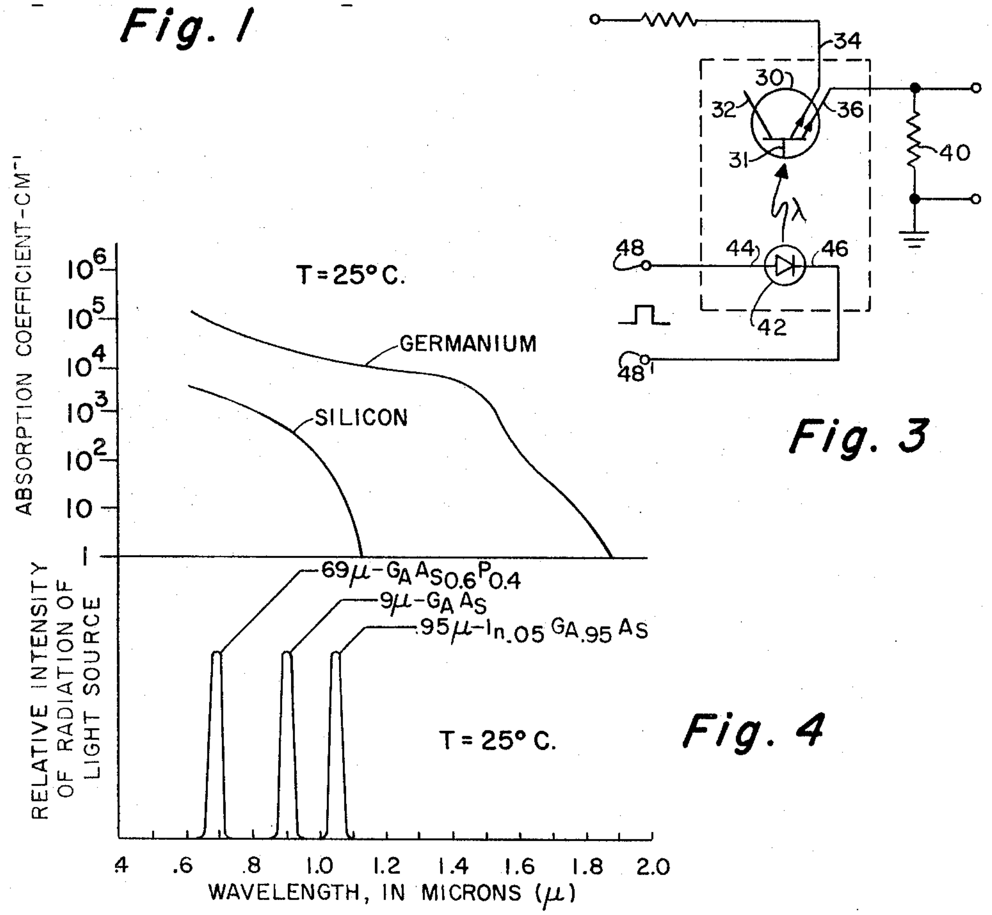
FIGURE 3 is an electrical schematic diagram of the preferred embodiment of the invention using a double-emitter, photosensitive transistor optically coupled to a light emitting semiconductor diode.
Figure 6:
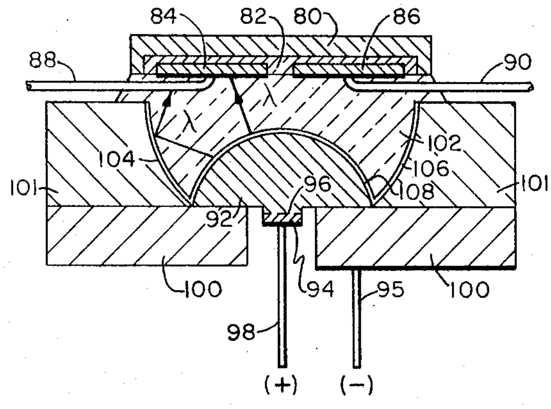
Figure 7:
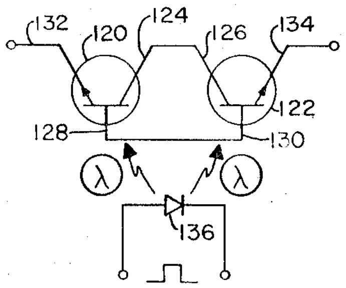
Figure 8:
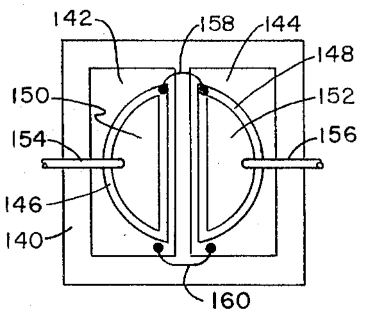
Figure 9:
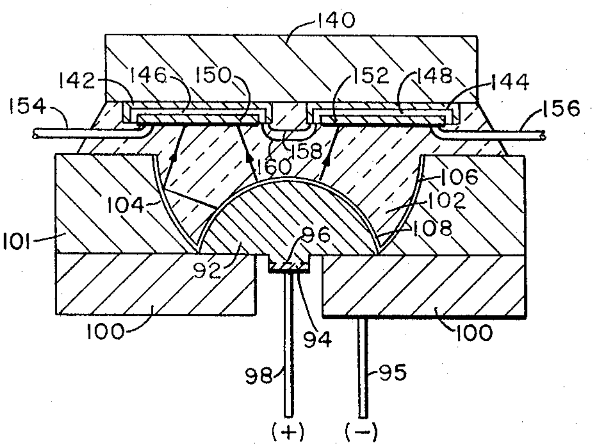
Figure 10:
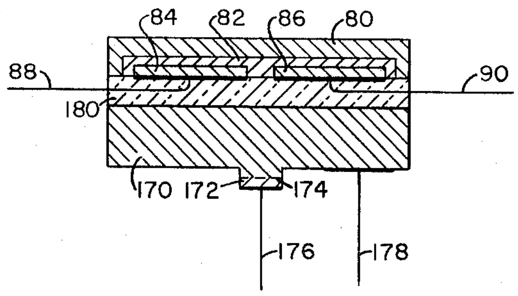

FIGURE 4 are graphical illustrations showing the relative coefficient of absorption of optical radiation as a function of wavelength for the semiconductor materials silicon and germanium as compared to the relative intensity of optical radiation as a function of wavelength for three different light emitting diodes comprised of gallium-arsenide-phosphide ($GaAs_{0.6}P_{0.4}$), gallium-arsenide (GaAs), and indium-gallium arsenide ($In_{.05}Ga_{.95}As$), respectively;

FIGURES *5a* and *5b* are, respectively, a plan view and an elevational view in section of the double-emitter, photosensitive transistor of planar construction used in the chopper of FIGURE 3;

FIGURE 6 is an elevational view in section of one embodiment of the chopper of the invention;

FIGURE 7 is an electrical schematic diagram of another embodiment of the invention using a pair of photosensitive transistors having commonly connected bases and collectors;

FIGURE 8 is a plan view of a pair of photosensitive transistors of planar construction having commonly connected bases and collectors;

FIGURE 9 is an elevational view in section of the chopper shown schematically in FIGURE 7; and FIGURE 10 is an elevational view in section of another embodiment of the light emitting diode used in the chopper.

Figure 1:
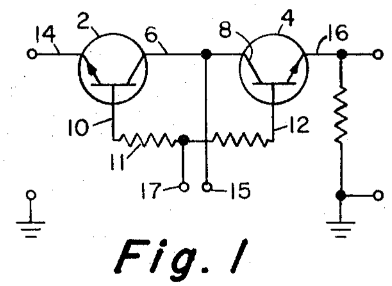
FIGURE 1 is an electrical schematic diagram of a pair of transistors having commonly connected bases and collectors such as used in conventional low level transistor choppers.
Figure 2:
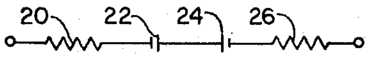
FIGURE 2 is an equivalent circuit of the circuit of FIGURE 1 when the transistors are conducting.

Transistors are frequently employed as switches in electrical circuits for various applications. It is desirable in the ideal case that when a switch is closed in an electrical circuit it be equivalent to a short circuit, and be equivalent to an infinite impedance when opened. Unfortunately, transistors are not equivalent to an ideal switch in that a series impedance and a junction voltage exist between the emitter and collector thereof when conducting. To overcome the junction voltage effect in chopper circuits, two transistors are normally used as a switching element with their collectors commonly connected and a resistor connected between their bases in order that the voltages generated across the junctions will oppose one another to provide a partial cancelling effect. Referring now to FIGURE 1, there are shown two transistors 2 and 4 connected according to this scheme, wherein the collector 6 of transistor 2 is connected to the collector 8 of transistor 4, and the base 10 of transistor 2 is connected to the base 12 of transistor 4 through a resistor 11. Connections 15 and 17 are made to the commonly connected collectors and bases, respectively, for applying a forward bias to the base-collector junctions to cause the transistors to conduct. The two transistors, when conducting, can be represented by an equivalent circuit as shown in FIGURE 2 where the resistance 20 and junction voltage 22 are in series between the collector 6 and emitter 14 of transistor 2, and the resistance 26 and junction voltage 24 are in series between the collector 8 and emitter 16 of transistor 4. By connecting similar transistors in backward fashion as shown in FIGURE 1, it is possible to provide a partial cancelling effect of the series junction voltages 22 and 24. Thus if a signal is applied to the emitter 14 of transistor 2 when the transistors are in a conductive state, a voltage will appear at the emitter 16 of the transistor 4, assuming that the net off-set voltage due to the junction voltages of the transistors is small as compared to the voltage being switched and the series resistance of the switch, when closed, is small as compared to the output load across which the input voltage is switched. The series resistance 20 of a transistor in the conductive state is characteristically in the order of a fraction to a few ohms and produces a voltage drop across the switch proportional to current. The junction voltage 22 is independent of current and is in the order of a few millivolts. The circuit configuration of FIGURE 1 is characteristically used to switch low level currents, where the voltage at the input of the chopper is normally in the order of a fraction of a volt, and the load across which the input signal is switched is in the order of several thousand to several hundred thousand ohms or greater. It is apparent, then, that a complete cancellation of the junction voltages is desirable, since each is normally of the order of magnitude of the input voltage. The voltage drop across the series resistance 20 will normally be small, since the series resistance is much, much less than the load resistance. The series resistance is low because of the operation of the transistors in their saturation mode when conducting.

Although pairs of similar transistors have been used as shown in FIGURE 1 to effect a partial cancellation of the junction voltage 22, it is very difficult to provide transistors having identical characteristics and junction voltages. At best, the net junction voltage is reduced from that of a single transistor. A more complete cancellation of junction voltages can be effected by means of a double-emitter transistor, which is a transistor with a single collector and base but with two emitters. Such devices are normally made by the diffusion process in an attempt to create collectors, bases and emitters of the transistors with identical characteristics, all of which are well known. Even then, however, the double emitter transistor is characterized by a net junction voltage across the two emitter terminals.

An electrical schematic diagram of the preferred embodiment of the invention is shown within the dashed enclosure of FIGURE 3, which has numerous advantages heretofore unattainable, as will be seen from the following description thereof. The invention has primary utility as a transistor chopper and comprises a double-emitter transistor 30 having a single base region 31, a single collector region 32, a pair of emitter regions 34 and 36 having very closely matched characteristics. The transistor, because of its semiconductor properties, is also photosensitive in that optical radiation of a suitable wavelength, when absorbed by the transistor bulk, will create hole-electron pairs. These charge carriers when collected at one or both of the junctions, cause the junctions to become forward biased and the transistor to conduct. Optically coupled to the transistor is a semiconductor junction diode 42 that generates optical radiation of a characteristic wavelength in response to a forward current bias generated across its junction. The diode is forward biased when the anode 44 is positive with respect to the cathode 46, such as by the application of a pulse between terminals 48 and 48′.

The input of the chopper circuit is taken between one of the emitters 34 and ground, and the output is taken at the other emitter 36 across a load 40 connected between the emitter and ground. The collector and base of the transistor are left "floating." When no light from the diode strikes the transistor, there is no forward bias applied to the junctions, and the transistor is non-conductive. When the diode is forward biased to generate light which impinges on the transistor, the light is absorbed in the bulk of the transistor to generate charge carriers, which are collected at the emitter-base and base-collector junctions and forward biases the transistor to conduction. Optical radiation of a sufficient intensity is generated by the diode 42 to cause the transistor to conduct in its saturation mode. A signal applied at the input terminals of the circuit will be switched across the load in response to light from the diode 42. By modulating the diode bias by means of a series of pulses at terminals 48 and 48′, a high frequency A.C. voltage can be developed at the output of the chopper across the load.

A light-emitting junction diode comprises of GaAs is described in the copending application of Biard et al. entitled Semiconductor Device, Serial No. 215,642, filed August 8, 1962, assigned to the same assignee, and is an example of a suitable solid-state light source such as diode 42 of FIGURE 3. As will be described hereinafter in more detail, the diode can be comprised of other semiconductor materials to produce optical radiation of different wavelengths. As described in the co-pending application, the diode comprises a body of semiconductor material which contains a diffused p-n rectifying junction. A forward current bias, when generated across the junction, causes the migration of holes and electrons across the junction, and recombination of electron-hole pairs results in the generation of optical radiation having a characteristic wavelength or photon energy approximately equal to the band gap energy of the particular semiconductor material of which the diode is fabricated. It will be noted from the above co-pending application that the generation of optical radiation in the diode is caused by a forward current bias at the junction and is an efficient solid state light source as contrasted to light generated by other mechanisms, such as reverse biasing the junction, avalanche processes, and so forth. The relative intensity of radiation as a function of wavelength for optical radiation generated by a gallium-arsenide p-n junction diode is shown in the lower graph of FIGURE 4, where it can be seen that the radiation intensity is greatest at a wavelength of .9 micron. Typical curves of the absorption coefficients of light as a function of wavelength for silicon and germanium are shown in the upper graph of FIGURE 4, where it can be seen that the .9 micron wavelength generated by a gallium-arsenide diode will be absorbed by a body comprised either of silicon or germanium. Similar curves are shown for light generated by diodes comprised of gallium-arsenide-phosphide ($GaAs_{0.6}P_{0.4}$), and indium-gallium-arsenide ($In_{.05}Ga_{.95}As$), where it can again be seen that either a germanium or silicon body will absorb the light of wavelengths of .69 micron and 0.95 micron, respectively. These compositions are enumerated as examples only, and other useful compositions will be described below. It will also be noted from the graphs of absorption coefficients that before any appreciable absorption occurs in silicon or germanium, the photon energy must be at least slightly greater than the band gap energies of silicon and germanium, respectively. The band gap energies for silicon and germanium are 1.04 e.v. and .63 e.v., respectively. The graphs of FIGURE 4 show that absorption begins in silicon at a wavelength of about 1.15 microns, which corresponds to a photon energy of about 1.07 e.v., and increases with shorter wavelengths and absorption begins in germanium at about 1.96 microns, which corresponds to a photon energy of about .64 e.v., and increases with shorter wavelengths. These two energies are greater than the respective band gap energies of the two materials, which clearly indicates the band-to-band transitions of electrons upon absorption which is the type of absorption with which the invention is concerned.

Since the optical radiation generated by the diode must be absorbed by the photosensitive transistor switch in such a manner to cause the transistor to conduct, it is important to consider in more detail the absorption phenomenon, which will more clearly illustrate the invention and its advantages. It can be seen from FIGURE 4 that the coefficient of absorption of light is less for longer wavelengths and, therefore, penetrates to a greater depth in a body of semiconductor material before being absorbed than does light of shorter wavelength. When light is absorbed in the transistor and generates charge carriers, the carriers, which are holes and electrons, must diffuse to one of the junction regions within the transistor in order to produce a bias to cause the transistor to conduct. In other words, the invention is not concerned with the photoconductive effect within the material of the detector, but a junction effect, wherein the characteristics of the junction are altered when current carriers created by absorption of photons are collected at the junction. Since the transistor conducts on a minority carrier flow within the base region, the light must be absorbed in the transistor within the diffusion length of the minority carriers produced thereby from one or both of the junctions. For longer wavelength light, the junction at which the carriers are collected must be at a relatively large depth below the surface of the transistor in order that the majority of the carriers produced by the light be collected. In other words, more depth of material is required before all of the light impinging on the surface of the transistor is absorbed, although a percentage of the light will be absorbed in each successive unit thickness of the transistor. Thus, the region over which the light is absorbed is relatively wide, and in order to insure the efficient collection at the junction of the majority of the charge carriers generated thereby, relatively high lifetime material is used in the transistor bulk. However, high lifetime material increases the diffusion time of the charge carriers from their point of origination to the junction, therefore decreasing the speed at which the transistor is turned on by the light. Conversely, by using optical radiation of shorter wavelength, the junction depth and lifetime of the semiconductor material can be correspondingly decreased without decreasing the collection efficiency, such as by the use of a light emitting diode comprised of $GaAs_{0.6}P_{0.4}$, for example.

Another factor to be considered is the particular construction of the photosensitive transistor. As noted earlier, the lower the off-set voltage of the transistor, the smaller the signal level that can be switched by the circuit. It is also well known that one way in which the off-set or junction voltage of a transistor can be reduced is by increasing the reverse current gain, $h_{FE}$. As will be described below, the preferred embodiment of the transistor is an all-diffused device of planar construction where opposite type conductivity determining impurities are diffused into a semiconductor body to form the collector-base and base-emitter junctions. A high reverse $h_{FE}$ is obtained by making the areas of the emitter regions as large as possible with respect to the area of the collector region.

The double emitter transistor is equivalent to a pair of closely matched transistors having commonly connected bases and collectors, and it can be shown that when the transistors are made to conduct by a forward bias on the collector-base junction alone, the off-set voltage of the chopper circuit is dependent on the degree of mismatch of the forward $h_{FE}$ of the two transistors. That is to say, with the same bias applied to both transistors to turn them on, and with the bias being applied only to the collector-base junction, the respective off-set voltages of the two transistors will be different if the forward $h_{FE}$ of the two transistors are different. In the structure of the invention as shown in FIGURE 3, light is absorbed in the emitter, base and collectors regions of the transistor which give the effect of a constant current drive on both the emitter-base and collector-base junctions of the two transistors, rather than a drive on the collector-base junction alone. Under these conditions, the off-set voltage is dependent on the reverse current gain of each unit, the relative values of the two current generators, and the forward current gain of each unit. By adjusting the relative position of the light source, namely, adjusting the relative postion of the junction died 42 with respect to the transistor 30, the relative values of the various current generators can be changed, and thus, the off-set voltage may be reduced to an arbitrarily small value.

The photosensitive transistor used in the invention is preferably an all-diffused, double-emitter, transistor of planar construction as shown in the plan view of FIGURE *5a* and the elevational view in section of FIGURE *5b* taken through lines *b—b* of FIGURE*5a*. A wafer 80 of semiconductor material, such as silicon or germanium, as examples, of a first conductivity type is used as the collector of the transistor, and an impurity of the opposite conductivity determining type is diffused into the collector region to form a circular base region 82. An impurity of the same conductivity type as the collector region is diffused into the base region to form a pair of semicircular emitter regions 84 and 86, respectively. The emitter regions are made as large as possible to achieve a high reverse $h_{FE}$. Electrical contacts 88 and 90 are provided to the two emiter regions 84 and 86, respectively, and correspond to the input and output of the chopper. As noted earlier, the depths of the collector-base junction and the base-emitter junction are designed for the particular wavelength of light emitted by the junction diode light source. Since the transistor has a single collector region, a single base region, and a pair of simultaneously diffused emiter regions, the latter will have very closely matched characteristics, and the transistor will approximate two identical transistors. Although the transistor has a single collector region and a single base region, it is only necessary that there be a commonly connected collector region for the two emitters. In other words, if the collectors of two transistors are connected together to form a series circuit, it is not essential that the bases be connected. However, it is more convenient to form a single collector region and a single base region in a diffused, double-emitter transistor, in addition to the fact that switching transients are reduced by interconnecting the base regions or by having a single base region common to two emitters.

Figure 5:
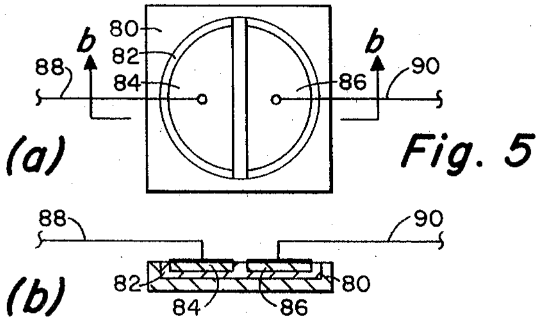

A side elevational view in section of one embodiment of the invention is shown in FIGURE 6, which comprises a double-emitter, photosensitive transistor of either the n-p-n or p-n-p variety as shown in FIGURE 5 and a semiconductor junction diode optically coupled thereto. There is also shown in FIGURE 6 a suitable structure for mounting the components of the chopper to provide the necessary optical coupling between the switch and the driving source. The light emitting junction diode comprises a hemispherical region 92 of a first conductivity type and a smaller region 94 of an opposite conductivity type contiguous therewith. An electrical connection 93 is made to the region 94 and constitutes the anode of the junction diode, and the flat side of the region 92 is mounted in electrical connection with a metallic plate 100 with the region 94 and lead 98 extending into and through a hole in the plate. An electrical lead 95 is provided to the metallic plate 100 and constitutes the cathode of the diode. The diode is fabricated by any suitable process, for example, by diffusion process described in the above co-pending application or by an epitaxial process to be described hereinafter, and contains a p–n rectifying junction at or near the boundary between the regions 92 and 94. The hemispherical shape of the dome is formed by any suitable process.

Another plate 101 is mounted about the diodes and defines a hemispherical reflector surface 104 about the hemispherical dome 92. The double-emitter transistor as shown in FIGURE 5 is mounted above the hemispherical dome with the emitters 84 and 86 facing the dome. A light transmitting medium 102 is used to fill the region between the reflector and the dome and for mounting the transistor above the dome, wherein the light transmitting medium acts as a cement to hold the components together. Ample space is provided between the top of the reflector plate 101 and the transistor for passing the leads 88 and 90 from the two emitters out of the region of the dome without being shorted to either the transistor or the reflector plate. These leads are held in place by the cement-like transmitting medium. When a forward bias current is passed through the junction of the radiant diode between the anode 98 and cathode 95, light is emitted at the junction, travels through the dome and the light transmitting medium 102 and strikes the surface of the transistor, where it is absorbed in the regions of both the emitter-base and base-collector junctions to cause the transistor to conduct.

The hemispherical dome structure is used in order to realize the highest possible quantum efficiency. If the proper ratio of the radius of the junction 96 to the radius of the hemispherical dome is selected, then all of the internally generated light that reaches the surface of the dome has an angle of incidence less than the critical angle and can be transmitted. The maximum radius of the diode junction with respect to the dome radius depends on the refractive index of the coupling medium, and since all of the light strikes the dome surface close to the normal, a quarter wavelength anti-reflection coating will almost completely eliminate reflection at the dome surface. The maximum radius of the diode junction to the dome radius is determined by computing the ratio of the index of refraction of the coupling medium to the index of refraction of the dome material. The dome, as shown in FIGURE 6, has a quarter wavelength anti-reflection coating 108 thereon comprised of zinc-sulfide to eliminate any possible reflection. A true hemispherical dome is optimum, because it gives the least bulk absorption of all spherical segments which radiate into a solid angle of $2\pi$ steradians or less. Spherical segments with height greater than their radius radiate into a solid angle less than $2\pi$ steradians, but have higher bulk absorption. Spherical segments with height less than their radius have less absorption but emit into a solid angle greater than $2\pi$ steradians and, therefore, direct a portion of the radiation away from the detector. Due to the presence of bulk absorption, the dome radius should be as small as possible to further increase the quantum efficiency of the unit.

The phototransistor has a radius of about 1.5 time the radius of the hemispherical dome, which allows all the light emitted by the dome to be directed toward the detector by the use of a simple spherical reflecting surface 104. Since most of the light from the hemispherical dome strikes the transistor surface at high angles of incidence, an anti-reflection coating on the detector is not essential and can be considered optional. The light transmitting medium 102 between the dome and the transistor should have an index of refraction high enough with respect to the indices of refraction of the dome and the transistor to reduce internal reflections and to allow the ratio of the junction radius of the diode to the dome radius to be increased. The medium should also "wet" the surfaces of the source and the detector so that there are no voids which would destroy the effectiveness of the coupling medium. The indices of refraction of the diode and the transistor are each about 3.6. A resin such as Sylgard, which is a trade name of the Dow Corning Corporation of Midland, Michigan, has an index of refraction of about 1.43 and is suitable for use as the light transmitting medium. Although this index is considerably lower than 3.6, it is difficult to find a "transparent" substance that serves this purpose with a higher index. In order to insure the highest reflectivity, the reflector surface 104 is provided with a gold mirror 106 which can be deposited by plating, evaporation, or any other suitable process.

The metallic plates 100 and 101 are preferably comprised of a metal or alloy having the same or similar coefficient of thermal expansion as the junction diode, such as Kovar, for example. Similarly, the coupling medium 102 preferably has the same or similar coefficient of thermal expansion, or alternately remain pliable over a wide, useful temperature range of normal operation. Again, Sylgard satisfies this requirement by being pliable.

The off-set voltage is particularly sensitive to the relative position of the junction diode light source and the transistor. During fabrication of the device of FIGURE 6, the relative positions are adjusted until the desired on impedance is obtained for a prescribed minimum value of the offset voltage. The adjustment is performed before the optical coupling material 102 has had time to set and become semirigid, and is accomplished by causing the diode to irradiate the transistor conductive while measuring the offset voltage between terminals 88 and 90. The matched coefficients of thermal expansion of the various components of the system and the pliable nature of the coupling medium prevent misalignment as a result of temperature changes during operation.

Another embodiment of the invention uses two separate phototransistors having commonly connected bases and collectors. An electrical schematic diagram of the basic elements of a transistor chopper is shown in FIGURE 7, wherein the collector 124 and base 128 of transistor 120 are connected to the collector 126 and base 130, respectively, of transistor 122. The emitter 132 of transistor 120 constitutes the input to the chopper, and the emitter 134 of transistor 122 constitutes the output of the chopper. A light emitting junction diode 136 is positioned as described previously to direct optical radiation on the transistors. This embodiment differs from the preferred embodiment described earlier only in the use of separate transistors. A plan view of a pair of separate transistors of the diffused type is shown in FIGURE 8, where separate wafers 142 and 144 of a first conductivity type material are used as the respective collectors of the transistors, and impurities of the opposite conductivity determining type are diffused into the respective wafers to form base regions 146 and 148. Impurities of the same conductivity type as the collector regions are diffused into the base regions to form emitter regions 150 and 152 with electrical connections 154 and 156 attached thereto. A wire 158 connects the two base regions, and wire 160 connects the two collector regions. The two transistors are mounted in close proximity, as shown, on a suitable tab or platform 140, such as 7052 Corning glass, which has a coefficient of thermal expansion that aproximately matches that of the other components. A side elevational view in section of an embodiment using the separate transistors as shown in FIGURE 9 wherein like reference numerals will refer to like parts as previously described. The chopper of this figure functions in the same manner as that described with reference to FIGURE 6, and the same considerations apply as to the materials of which the chopper is comprised.

Various compositions of the light emitting diode and photosensitive transistor have been mentioned in conjunction with the graphs of FIGURE 4, wherein the preferred compositions depend upon several factors including the absorption coefficient of the photosensitive transistor, the ultimate efficiency to be achieved from the diode, and other factors as will be presently described. One factor to be considered is the speed of response of the photosensitive transistor to the optical radiation, wherein it has been seen that light of shorter wavelength gives a faster switching time because of the greater coefficient of absorption of the detector. This factor, if considered by itself, would indicate that a diode comprised of a material which generates the shortest possible wavelength is preferred. However, the efficiency of the light source must also be considered, in which the overall efficiency can be defined as the ratio of the number of photons of light emerging from the dome to the number of electrons of current to the input of the diode, and the internal efficiency is the ratio of the number of photons of light generated in the diode to the number of input electrons.

It was pointed out in the above co-pending application that, in most cases, less of the light generated internally in the diode is absorbed per unit distance in the n-type region than in the p-type region. Moreover, n-type material can normally be made of higher conductivity than p-type material of the same impurity concentration. Thus, the dome is preferably of n-type conductivity material. In addition to this factor, it has been found that the greater the band gap of the material in which the light is generated, the shorter the wavelength of the light, wherein the frequency of the generated light is about equal to or slightly less than the frequency separation of the band gap. It has further been found that the light is absorbed to some extent in the material in which it is generated or in a material of equal or less band gap width, but is readily transmitted through a material having a band gap width at least slightly greater than the material in which the light is generated. In fact, a sharp distinction is observed between the efficient transmission of light through a composition whose band gap is slightly greater than the composition in which the light is generated, and through a composition having a band gap equal to or less than that of the generating composition. This implies that the light is readily transmitted through a material the frequency separation of the band gap of which is greater than the frequency of the generated light.

To take advantage of this knowledge, the light emitting diode, in the preferred embodiment, is comprised of two different compositions in which the junction at or near which the light is generated is located in a first region of the diode comprised of a material having a first band gap width and of p-type conductivity, and in which at least the major portion of the dome is comprised of a second material having a second band gap width greater than the first material and is of n-type conductivity. Thus, light generated in the first material has a wavelength which is long enough to be efficiently transmitted through the dome. There are several materials that have been found to be internally efficient light generators when a forward current is passed through a junction located therein, in addition to GaAs noted in the above co-pending application. The material indium-arsenide, InAs, has a band gap width of about .33 e.v. and, if a p-n junction is formed therein, will generate light having a wavelength of about 3.8 microns, whereas light from GaAs is about .9 micron. The compositions $In_xGa_{1-x}As$, where $x$ can go from 0 to 1, give off light of wavelength which varies approximately linearly with $x$ between 3.8 microns for InAs when $x=1$ to .9 micron for GaAs when $x=0$. On the other side of GaAs is the composition gallium phosphide, GaP, which has a band gap of about 2.25 e.v. and emits radiation of about .5 micron. Also, the compositions $GaAs_xP_{1-x}$, where $x$ can go from 0 to 1, give off light of wavelength which varies approximately linearly with $x$ between .9 micron for GaAs when $x=1$ to .5 micron for GaP when $x=0$. It has been found, however, that for various reasons, the internal efficiency of light generation begins to drop off when the band gap of the material used is as high as about 1.8 e.v., which aproximately corresponds to the composition $GaAs_{0.6}P_{0.4}$, or for $x$ equal to or less than about 0.6 for the compositions $GaAs_xP_{1-x}$.

Referring again to the FIGURE 6 and more specifically to the construction of the light emitting diode, a preferred embodiment comprises a dome 92 of n-type conductivity material with a smaller region 94 contiguous therewith in which a portion is of p-type conductivity. The region 94 is comprised of a composition having a first band gap width, and the dome 92 is comprised of a region having a second band gap width greater than that of region 94. The rectifying junction 96 is formed in the region 94 of smaller band gap width so that the light generated herein will be efficiently transmitted through the dome. The portion of region 94 between the junction 96 and the dome is of n-type conductivity. Referring to the graphs of FIGURE 4 and the foregoing discussion, a preferred composition for the region 94 is one which will generate as short a wavelength as possible in order to have a high coefficient of absorption in the transistor for fast switching action, and yet which will be efficiently transmitted by the dome 92. At the same time, the composition of region 94 should have a high internal efficiency as a light generator. The composition $GaAs_{0.6}P_{0.4}$ will efficiently produce light of wavelength of about .69 micron and constitutes a preferred material for the smaller region 94. By making the dome of a composition of band gap slightly greater than that of the region 94, such as $GaAs_{0.5}P_{0.5}$, for example, or for $x$ equal to or less than 0.5 for the compositions $GaAs_xP_{1-x}$, the light will be efficiently transmitted. It should be noted that although the dome is comprised of a composition that does not have a high internal efficiency of light generation, this is immaterial, since the light is actually generated in the smaller region 94 of high efficiency. Thus, the dome material can be extended to compositions of relatively high band gap widths, even to GaP, without decreasing the overall efficiency of the unit.

Other compositions and combinations thereof can be used, such as various combinations of $In_xGa_{1-x}As$ or $GaAs_xP_{1-x}$, or both. In addition, most III–V compounds can be used, or any other material which generates light by a direct recombination process when a forward current is passed through a rectifying junction therein. Moreover, the entire light emitting diode can be comprised of a single composition such as, for example, GaAs as described in the above co-pending application. It can, therefore, be seen how the compositions of the various components of the system can be varied to achieve various objectives, including the highest overall efficiency of the entire system. Undoubtedly, other suitable compositions and combinations thereof will occur to those skilled in the art.

The light emitting diode can be made by any suitable process. For example, if two different compositions are used, a body or wafer constituted of a single crystal of one of the compositions can be used as a substrate onto which a single crystal layer of the other composition is deposited by an epitaxial method, which method is well known. Simultaneous with or subsequent to the epitaxial deposition, the rectifying junction can be formed in the proper composition, slightly removed from the boundary between the two, by the diffusion of an impurity that determines the opposite conductivity type of the composition. By etching away most of the composition containing the junction, the small region 94 can be formed. If the entire light emitting diode is comprised of a single composition, a simple diffusion process can be used to form the junction. The shape of the dome is formed by any suitable method, such as, for example, by grinding or polishing the region 92.

A third embodiment of the invention is shown in FIGURE 10, which is an elevational view in section of a planar constructed light emitting diode optically coupled to a double emitter transistor. Two separate transistors as shown in FIGURE 9 can also be used in this embodiment and is not limited to the double emitter transistor shown. The light emitting diode comprises a wafer 170 of semiconductor material of a first conductivity type into which is diffused an impurity that determines the opposite conductivity type to form a region 172 of said opposite conductivity type separated from the wafer 170 by a rectifying junction 174. The wafer is etched to cut below the junction and form the small region 172. Alternatively, the region 172 can be formed by an epitaxial process. Electrical leads 176 and 178 are connected to the region 172 and wafer 170 as previously described.

The wafer 170 is not formed into a dome structure in this embodiment, but is left in a planar configuration and optically coupled to the detector, such as a double emitter transistor, as shown, with a suitable coupling medium 180 as noted earlier. This embodiment is more expedient to fabricate, as can be readily seen, and thus is advantageous in this respect. As indicated above, the dome structure is used to realize a high quantum efficiency, since all of the internally generated light strikes the surface of the dome at less than the critical angle, and thus little, if any, light is lost to internal reflections within the dome. This is not necessarily the case in the planar embodiment of FIGURE 10, and in order to achieve a high quantum efficiency, the diameter of the apparent light emitting surface of wafer 170, assuming a circular geometry, can be made somewhat smaller than the combined diameters or lateral dimensions across the two emitters of the detector. The apparent light emitting surface of the diode is determined by the thickness of wafer 170, the area of the light emitting junction 174, and the critical angle for total internal reflection. The critical angle of reflection is determined by computing the arcsine of the ratio of the index of refraction of the coupling medium 180 to the index of refraction of the semiconductor wafer 170.

In the preceding discussions, it was noted that a coupling medium having a suitable index of refraction is preferably used between the light emitting diode and the detector. If such a medium is used, it should have a high index to match, as closely as possible, that of the two components between which it is situated. Materials other than Sylgard can also be used, such as a high index of refraction glass. However, it can prove expedient and desirable in certain cases to couple the two components together with air, where a physical coupling is either impractical or impossible, and such a system is deemed to be within the intention of the present invention.

Although the preferred embodiment of the light emitting diode contains the junction in the region 94 below the boundary between the two regions 92 and 94, the junction can also be formed at this boundary or actually within the dome region 92 should this be more expedient for one or more reasons. In the case where the entire diode is comprised of a single composition, for example, an equally as efficient light emitter can be made by locating the junction other than as shown in the preferred embodiment.

Other modifications, substitutions and alternatives will undoubtedly occur that are deemed to fall within the scope of the present invention, which is intended to be limited only as defined in the appended claims.

What is claimed is:

1. An electro-optical chopper for switching an electrical signal from a first circuit to a second circuit, comprising:

(a) a pair of transistors comprised of a first semiconductor material each having an emitter region, a base region, a collector region, emitter-base junction and collector-base junction with the base and collector regions of one of said pair of transistors interconnected with the base and collector regions, respectively, of the other of said pair of transistors to effect at least a partial cancellation of the junction voltages as measured between the emitter regions of said pair of transistors when conducting.

(b) an input terminal connected to the emitter region of said one of said pair of transistors for connection into said first circuit and for the application of said electrical signal thereto, (c) an output terminal connected to the emitter region of said other of said pair of transistors for connection into said second circuit, (d) said pair of transistors conducting in response to optical radiation incident thereon which has a photon energy greater than the band gap energy of said first semiconductor material, and (e) a semiconductor light emitting device for generating optical radiation having a photon energy greater than the band gap energy of said first semiconductor material electrically isolated from but optically coupled to said pair of transistors for directing said optical radiation thereon.

(f) said light emitting device having a first region of one conductivity type and a second region of an opposite conductivity type contiguous to and forming a rectifying junction with said first region and generating said optical radiation when a current is caused to flow through said junction in a forward direction.

2. An electro-optical chopper according to claim 1 wherein said rectifying junction of said light emitting device is located within a second semiconductor material which has a band gap energy greater than that of said first semiconductor material.

3. An electro-optical chopper according to claim 1 wherein at least a portion of said optical radiation is absorbed in said pair of transistors within a minority carrier diffusion length from the collector-base junctions thereof.

4. An electro-optical chopper for switching an electrical signal from a first circuit to a second circuit, comprising:

(a) transistor means comprised of a first semiconductor material having a collector region, a base region forming a rectifying junction with said collector region, and a pair of emitter regions each forming a rectifying junction with said base region, (b) an input terminal connected to one of said pair of emitter regions for connection into said first circuit and for the application of said electrical signal thereto, (c) an output terminal connected to the other of said pair of emitter regions for connection into said second circuit, (d) said transistor means conducting in response to optical radiation incident thereon which has a photon energy greater than the band gap energy of said first semiconductor material, and (e) a semiconductor light emitting device for generating optical radiation having a photon energy greater than the band gap energy of said first semiconductor material electrically isolated from but optically coupled to said transistor means for directing said optical radiation thereon, (f) said light emitting device having a first region of one conductivity type and a second region of an opposite conductivity type contiguous to and forming a rectifying junction with said first region and generating said optical radiation when a current is caused to flow through said junction in a forward direction.

5. An electro-optical chopper according to claim 4 wherein said rectifying junction of said light emitting device is located within a second semiconductor material which has a band gap energy greater than that of said first semiconductor material.

6. An electro-optical chopper according to claim 4 wherein at least a portion of said optical radiation is absorbed in said transistor means within a minority carrier diffusion length from the collector-base junction thereof.

7. An electro-optical chopper according to claim 4 wherein said transistor means and said light emitting device are optically coupled together with a solid light transmitting medium.

8. An electro-optical chopper according to claim 4 wherein an exterior surface of said transistor means defines a plane that intersects said pair of emitter regions, and said surface faces said light emitting device.

9. An electro-optical chopper according to claim 8 wherein a major portion of each of said rectifying junctions of said transistor means is substantially parallel to said surface.

10. An electro-optical chopper according to claim 4 wherein said first region and a portion of said second region of said light emitting device are comprised of a second semiconductor material, and the rest of said second region is comprised of a third semiconductor material.

11. An electro-optical chopper according to claim 8 wherein said rectifying junction of said light emitting device is substantially parallel to said surface with said first region and a portion of said second region being comprised of a second semiconductor material, and the rest of said second region being comprised of a third semiconductor material, said second region being disposed between said first region and said transistor means.

12. An electro-optical chopper according to claim 11 wherein a major portion of each of said rectifying junctions of said transistor means is substantially parallel to said surface.

13. An electro-optical chopper according to claim 11 wherein said second semiconductor material has a band gap energy greater than that of said first semiconductor material, and said third semiconductor material has a band gap energy greater than that of said second semiconductor material.

14. An electro-optical chopper according to claim 8 wherein said rectifying junction of said light emitting device is substantially parallel to said surface with said second region being disposed between said first region and said transistor means.

15. An electro-optical chopper according to claim 14 wherein said second region defines a hemispherical surface facing said transistor means with said rectifying junction of said light emitting device being substantially parallel to the base thereof.

16. An electro-optical chopper according to claim 15 including reflecting surfaces disposed laterally about said hemispherical surface for directing said optical radiation on said surface of said transistor means.

17. An electro-optical chopper according to claim 14 wherein said second region defines a planar surface facing said transistor means.

18. An electro-optical chopper according to claim 5 wherein said first semiconductor material is selected from the group consisting of silicon and germanium, and said second semiconductor material is selected from the group consisting of compounds of elements of Groups III and V of the periodic table.

References Cited by the Examiner

UNITED STATES PATENTS

| | | | |
|---|---|---|---|
| 2,779,877 | 1/1957 | Lehovec | 250—211 |
| 3,043,958 | 7/1962 | Diemer | 250—211 |
| 3,128,412 | 4/1964 | Abromaitis | 307—88.5 |
| 3,177,414 | 4/1965 | Kurosawa et al. | 317—235 |
| 3,229,104 | 1/1966 | Rutz | 250—211 |

OTHER REFERENCES

Gilleo et al.: Electronics, November 22, 1963, pp. 23–27.

Wolff: Electronics, June 21, 1963; pp. 24, 25.

Wolff: Electronics, June 28, 1963; pp. 32–34.

RALPH G. NILSON, *Primary Examiner.*

WALTER STOLWEIN, *Examiner.*